(12) United States Patent (10) Patent No.: US 8,679,393 B1
Willwerth et al. (45) Date of Patent: Mar. 25, 2014

(54) ELECTROMAGNETIC INTERFERENCE AND RADIO FREQUENCY ABSORBING MATERIAL AND PROCESS FOR FORMING THE SAME

(75) Inventors: Charles M. Willwerth, Amesbury, MA (US); Himanshu R. Patel, Andover, MA (US); Matthew D. Dodier, Fitchberg, MA (US); John V. Kapeckas, Lowell, MA (US)

(73) Assignee: Majilite Corporation, Dracut, MA (US)

( * ) Notice: Subject to any disclaimer, the term of this patent is extended or adjusted under 35 U.S.C. 154(b) by 131 days.

(21) Appl. No.: 13/015,485

(22) Filed: Jan. 27, 2011

Related U.S. Application Data

(62) Division of application No. 11/697,505, filed on Apr. 6, 2007, now Pat. No. 7,897,882.

(60) Provisional application No. 60/790,058, filed on Apr. 6, 2006.

(51) Int. Cl.
*H05K 9/00* (2006.01)

(52) U.S. Cl.
USPC ............ 264/308; 264/212; 174/377; 361/818

(58) Field of Classification Search
USPC ........... 427/212, 180; 264/212, 308; 174/377; 361/818
See application file for complete search history.

(56) References Cited

U.S. PATENT DOCUMENTS

| 4,251,928 | A | * | 2/1981 | Rotar et al. ...................... 34/116 |
| 5,091,242 | A | | 2/1992 | Chung |
| 6,284,817 | B1 | * | 9/2001 | Cross et al. .................... 523/220 |
| 6,565,975 | B2 | * | 5/2003 | Umehara et al. ............... 428/413 |
| 6,620,337 | B1 | * | 9/2003 | Ono et al. ................... 252/62.54 |
| 7,488,901 | B2 | | 2/2009 | Arnold |
| 2002/0148626 | A1 | | 10/2002 | Matsumura et al. |
| 2004/0022358 | A1 | * | 2/2004 | Tomita ............................. 378/70 |
| 2006/0099403 | A1 | * | 5/2006 | Johnson ......................... 428/323 |

FOREIGN PATENT DOCUMENTS

WO WO 2006/022463 A1 3/2006

OTHER PUBLICATIONS

Liu et al., "Reflection and Absorption contributions to the electromagnetic interference shielding of single walled-carbon nanotube/polyurethane composites" Carbon 45 (Jan. 2007) 821-827.*
Restriction Requirement for U.S. Appl. No. 11/697,505, mail date Jun. 26, 2008, 6 pages.
Reply and Amendment for U.S. Appl. No. 11/697,505, mail date Jul. 25, 2008, 6 pages.
Office Action for U.S. Appl. No. 11/697,505, mail date Nov. 25, 2008, 8 pages.
Reply and Amendment for U.S. Appl. No. 11/697,505, mail date Feb. 25, 2009, 16 pages.
Office Action for U.S. Appl. No. 11/697,505, mail date Jun. 2, 2009, 11 pages.

(Continued)

*Primary Examiner* — Galen Hauth
(74) *Attorney, Agent, or Firm* — Foley & Lardner LLP (57) ABSTRACT

A method for producing an EMI/RF absorbing material including dispersing metallic flakes in a resin. The method also includes providing a first coat of the resin containing dispersed metallic flake to form a first layer. The method further includes providing a second coat of the resin containing dispersed metallic flake to the first layer to form a second layer. At least one of the first or second layers has a substantially uniform distribution of metallic flake throughout a thickness of the first or second layers.

28 Claims, 5 Drawing Sheets

(56) References Cited

OTHER PUBLICATIONS

Request for Continued Examination, Reply and Amendment, and Declaration for U.S. Appl. No. 11/697,505, mail date Sep. 2, 2009, 37 pages.
Office Action for U.S. Appl. No. 11/697,505, mail date Nov. 27, 2009, 9 pages.
Supplemental Office Action for U.S. Appl. No. 11/697,505, mail date Dec. 17, 2009, 13 pages.
Reply and Amendment for U.S. Appl. No. 11/697,505, mail date Apr. 19, 2010, 22 pages.
Declaration for U.S. Appl. No. 11/697,505, mail date Apr. 20, 2010, 28 pages.
Office Action for U.S. Appl. No. 11/697,505, mail date Jul. 7, 2010, 6 pages.
Reply and Amendment for U.S. Appl. No. 11/697,505, mail date Sep. 2, 2010, 9 pages.
Office Action for U.S. Appl. No. 11/697,505, mail date Sep. 14, 2010, 3 pages.
Reply and Amendment for U.S. Appl. No. 11/697,505, mail date Oct. 7, 2010, 10 pages.
Notice of Allowance for U.S. Appl. No. 11/697,505, mail date Oct. 25, 2010, 6 pages.
Amendment for U.S. Appl. No. 11/697,505, mail date Jan. 20, 2011, 3 pages.
WAVE-X®, EMI Suppression and Absorption, ARC Technologies, Inc., date unknown, 6 pages.

* cited by examiner

ELECTROMAGNETIC INTERFERENCE AND RADIO FREQUENCY ABSORBING MATERIAL AND PROCESS FOR FORMING THE SAME

CROSS-REFERENCE TO RELATED PATENT APPLICATIONS

This application is a Divisional of U.S. patent application Ser. No. 11/697,505, filed Apr. 6, 2007, which claims priority to and the benefit of U.S. Patent Application 60/790,058, filed Apr. 6, 2006, both of which are incorporated herein by reference in their entirety.

BACKGROUND

The present invention relates generally to the field of materials used to absorb and shield electromagnetic interference (EMI), radio frequency radiation (RF), or other such phenomena (collectively EMI/RF) and the process for making such materials and in particular to a formed thermoplastic material which incorporates materials designed to absorb and shield electromagnetic interference and radio frequency radiation and the like from the user of an electronic device emitting such interference.

EMI and RF waves may be generated both by the internal components of an electronic device and sources external to the device. The EMI and/or RF radiation may cause a decrease in performance of electronic devices and interfere with wireless communication devices. EMI and RF radiation may be especially problematic for consumer electronics devices such as digital cameras, cellular or digital phones, RF transmitters and receivers, personal digital assistants, computers and computer components, and other such devices. The EMI and RF radiation may interfere with wireless transmissions causing an increase in noise that detracts from signal quality. Also, the EMI or RF generated by one electronic component in a device may disrupt the performance of another component in the same device.

Many consumer electronic devices, however, are made to be as compact as possible. This limits the ways in which EMI and RF radiation can be dealt with within these devices.

Accordingly it would be desirable to provide material or a process for producing a material that is capable of shielding EMI and/or RF that could otherwise interfere with the performance of an electronic device. It would also be desirable to provide a material that may be provided in a variety of configurations such that it may be used in a variety of electronic devices.

SUMMARY

One embodiment of the disclosure relates to a method for producing an EMI/RF absorbing material including dispersing metallic flakes in a resin. The method also includes providing a first coat of the resin containing dispersed metallic flake to form a first layer. The method further includes providing a second coat of the resin containing dispersed metallic flake to the first layer to form a second layer. At least one of the first or second layers has a substantially uniform distribution of metallic flake throughout a thickness of the first or second layers.

Another embodiment of the disclosure relates to a method for providing an EMI/RF absorbing material formed from at least two layers including providing a first layer having a thickness and including metallic flake dispersed in a polymer resin. The metallic flake is substantially uniformly distributed throughout the thickness of the first layer. The method also includes providing a second layer having a thickness and including metallic flake dispersed in a polymer resin. The metallic flake is substantially uniformly distributed throughout the thickness of the second layer. The EMI/RF absorbing material has a substantially uniform distribution of the metallic flake throughout the total thickness of the first and second layers of the EMI/RF absorbing material.

Yet another embodiment of the disclosure relates to a method for manufacturing an EMI/RF absorbing film including dispersing EMI/RF absorbing material in a polymer resin. The method also includes distributing the polymer resin and the dispersed EMI/RF absorbing material on a releasable medium. The method further includes curing the polymer resin to form a film. The method still further includes releasing the cured polymer resin film from the release medium. The EMI/RF absorbing material is substantially uniformly distributed throughout a thickness of the film.

Yet another embodiment of the disclosure relates to a method for manufacturing an EMI/RF absorbing material having a relatively heavy metallic flake dispersed in a resin. The method includes providing a reservoir of resin and providing metallic flake in the resin. The method also includes recirculating the resin and metallic flake to aid in preventing settling of the metallic flake within the resin. The method further includes distributing the resin and metallic flake to create a first layer and curing the first layer.

Yet other embodiments of the disclosure relate to electronic devices including the EMI/RF absorbing material.

DETAILED DESCRIPTION

A process for forming a sheet or film of flexible and moldable EMI/RF absorbing material may generally include coating a thermoplastic resin suspension of an energy absorbing flake onto a release medium and curing in a continuous process (referred to interchangeably as transfer coating or cast coating). The release medium may then be stripped and discarded in subsequent processes to yield the unsupported energy absorbing sheet material.

In some embodiments the material may include a flexible, moldable, thermoplastic resin such as a polyurethane resin. The cured resin must be sufficiently strong, but is preferably flexible enough for the material to be used in a variety of electronic devices. One suitable polyurethane resin is SOLU-COTE 6629 available from SOLUOL, INC., of East Providence, R.I. SOLUCOTE 6629 is an aliphatic polyurethane in a solvent blend of toluene, isopropyl alcohol (IPA), and dimethylformamide (DMF). Other commercially available resin systems may be used including polyvinylchloride, polyethylenes, polypropylenes, and other thermoplastic resins. In other embodiments, various natural and/or synthetic polymers, may be used.

To provide the material with the desired EMI/RF shielding characteristics, a heavy metal flake may be added to the solvated resin. In some embodiments, a permalloy flake (containing nickel, iron, and optionally molybdenum) is used. Some or all of the permalloy flake may be coated, for example, with a ceramic material. In embodiments where a mixture of coated and uncoated permalloy flake is present, the weight ratio of coated to non coated permalloy flake may be in the range from about 1:10 to 10:1. In some of these embodiments, the ratio may more desirably be from about 2:1 to 8:1, and even more preferably from about 3:1 to 6:1. In other embodiments, other EMI/RF absorbing materials may be used. For example, metal powders or ceramic materials with suitable absorption characteristics may be used.

To facilitate mixing of the metal flake in the resin, a dispersing and/or wetting agent may be used. The dispersant may be any known dispersant capable of use in solids suspension mixtures. One suitable dispersing agent is DISPER-BYK-111, commercially available from BYK-CHEMIE GmbH of Wesel, Germany. Other suitable dispersants include, but are not limited too; acrylates, alcohols, alkyds, amino compounds, betaines, sulfonates, carboxylic acids, epoxies, fatty acids, glycols, mineral oils, oxazolidines, phosphorus based compounds, silicon based compounds, low molecular weight polymers and waxes. Optionally, other agents that aid in dispersion of the flake may be used. Such agents include leveling aids, defoamers, anti-defoamers, surfactants, and other suitable agents.

Additional solvent may be used to obtain a desired viscosity for processing the material. In an exemplary embodiment, a combination of toluene, DMF, and IPA may be used. Alternatively, other solvents that are compatible with the resin may be used. The solvent mixture may be chosen to optimize material flow and curing/drying times. Other suitable solvents may be selected based on the selected polymer.

A wide variety of natural and synthetic resins may be used. Each such resin will present unique solvent and dispersant requirements. While the flake loading in the material may be adjusted for specific applications, the use of coated flake without any uncoated flake may yield adequate flake dispersions. However, it may be more cost effective to include a portion of uncoated flake. A slurry of flake, resin, and solvent may incorporate up to 40 wt % or more of metallic flake (i.e. combined coated and uncoated flake). In some embodiments, the material may be made from a mixture comprising the following components:

| Component | Weight Percent |
|---|---|
| Resin (including solvent) | 20-60% |
| Dispersing Agent | 0.5-2% |
| Uncoated Flake | 0-40% |
| Coated Flake | 0-40% |
| Total Flake | 4-40% |
| DMF | 0-30% |
| IPA | 0-30% |
| Toluene | 0-30% |

In some embodiments, the solvated material is coated onto a transfer medium. The transfer medium is preferably a releasable medium such as release paper. Other mediums may be used provided they have adequate adhesion and release properties. One release medium that is suitable for use in the process is flat paper such as T2000s and other grained paper each coated with polypropylene, silicone or acrylics may work. Another example would be S/K VLC release paper available from S.D. WARREN of Westbrooke, Me.

The solvated material may be dispensed from a tank to a coating machine where the solvated material is coated onto the release medium.

Figure 1:
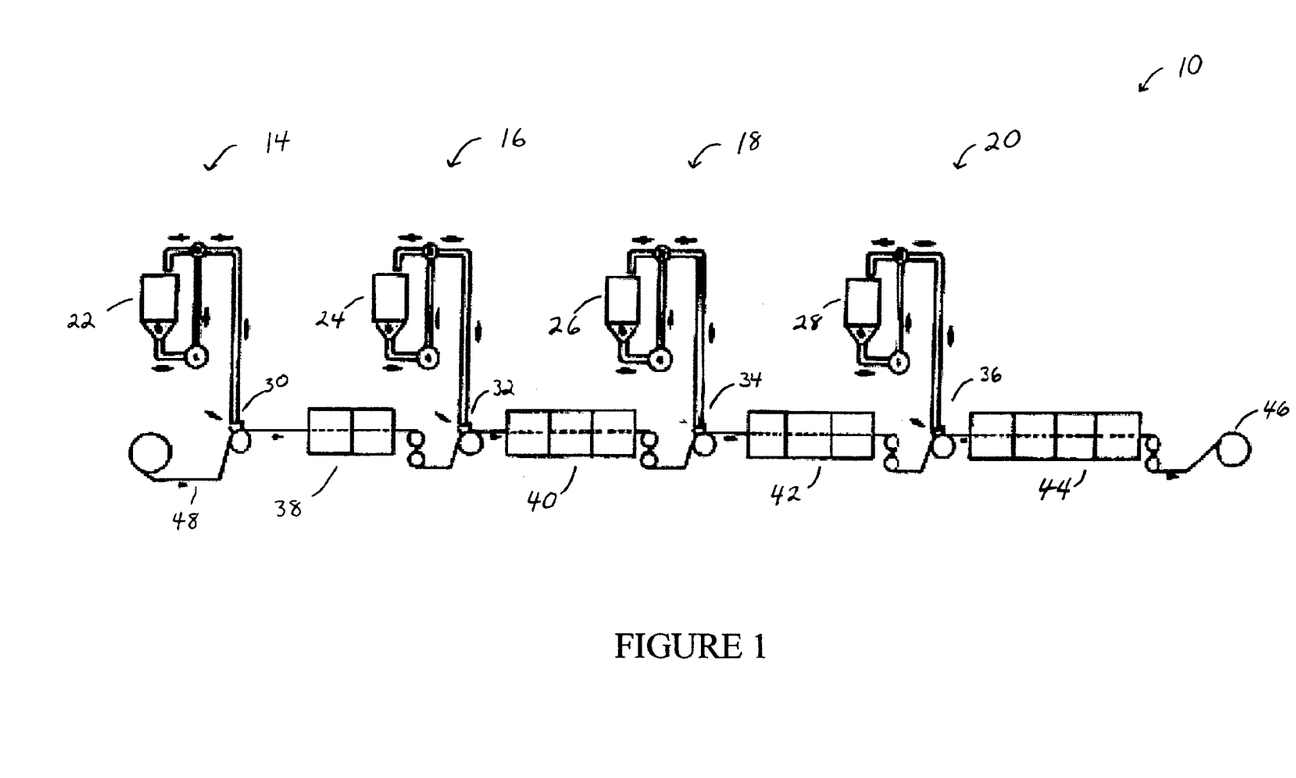
FIG. 1 is a schematic of the process of forming a thin thermoplastic film which incorporates elements to shield and absorb electromagnetic interference, radio frequency radiation, and the like according to one aspect of the innovation.

As shown in FIG. 1, system 10 includes a release medium roll 12, and one or more coating subsystems 14, 16, 18, and 20. Each coating subsystem in turn includes a dispersing tank (22, 24, 26, and 28), a coater (30, 32, 34, and 36), and a curing system shown as ovens 38, 40, 42, and 44. A coated release medium is wound onto an uptake roll 46.

According to this embodiment, a release paper 48 is fed to coater 30 which is shown as a knife and roll type coater. Solvated material is fed to the coater 30 to place a layer of material on the release paper 48. The paper and solvated material are fed to oven 38 which is shown as a two stage oven. Any of the ovens described herein may be single or multistage ovens. The solvated material is dried leaving a layer of metal flake suspended in a polymer matrix coated onto the release paper.

The coated paper may then be passed through subsequent coaters 32, 34, and 36 and ovens 40, 42, and 44 to gradually increase the thickness of the coating on the release paper. The preferred multistage process reduces individual drying times in the oven which may help avoid flake settling within the solvated material. This provides a more uniform distribution of flake throughout the total thickness of the coating. After all the desired layers of material have been applied and dried, the coated release paper is taken up on take-up roll 46 and may be transferred to additional processing steps or stored. Alternatively, the coated release paper may be fed directly to another process (e.g., calendering) without being rolled.

In downstream processing, the release paper may be removed to yield an unsupported EMI/RF absorbing film. The film may be calendered to increase the density of the film and improve its EMI/RF absorption or processing characteristics. The film may also be laminated to provide an EMI/RF barrier of a desired thickness.

Figure 2:
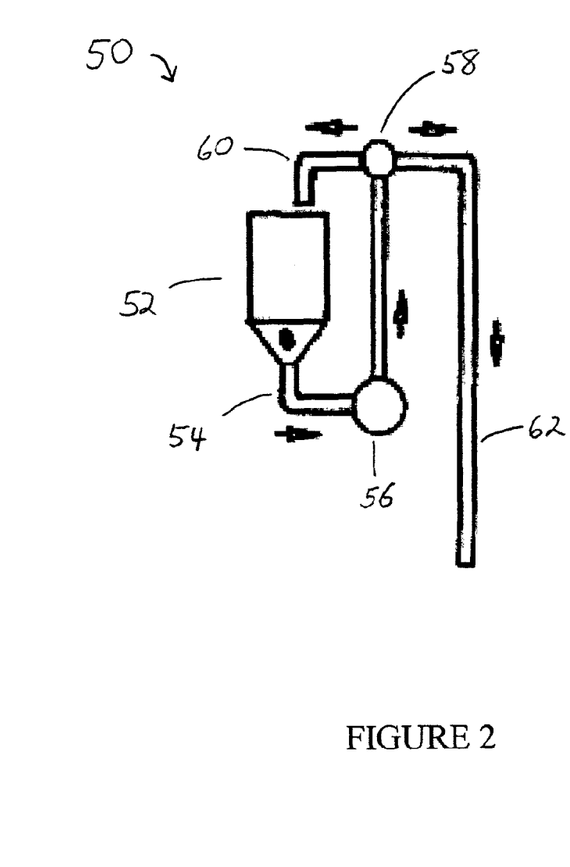
FIG. 2 is a schematic of the recirculation process for the heavy metal flake used to absorb and shield EMI/RF.

FIG. 2 illustrates a recirculation system that may be used to prevent settling of the suspended flake in the dispersing tanks of system 10 shown in FIG. 1. Subsystem 50 includes dispersing tank 52, outlet 54, pump 56, valve 58, recirculating line 60 and line 62. Pump 56 draws flake laden resin from dispersing tank 52 and directs the flow to valve 58. Valve 58 is shown as a three way valve which may be controlled to direct a portion of the flow back to dispersing tank 52. The recirculating flow keeps the contents of the dispersing tank 52 moving within the tank and aids in preventing settling of the flake. A portion of the flow through valve 58 may also be directed to line 62 which delivers the flake laden resin to a coating head.

According to some embodiments, the ratio of material taken off to the coater to material recirculated to the dispersing tank may be from about 0%:100% to 100%:0%. The ratio selected for a given application will depend on a variety of factors including the volume of the dispersing tanks, flow rates required for the coater and other operating parameters.

Figure 3:
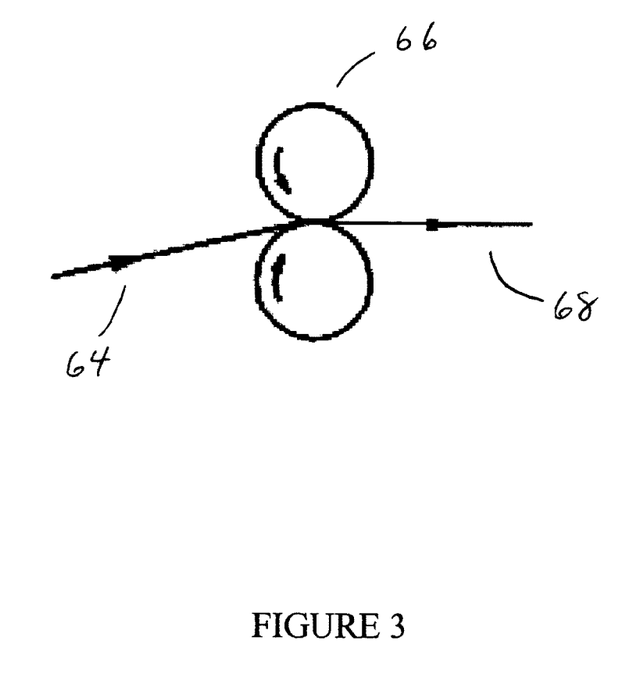
FIG. 3 is a schematic of the post calendering process for forming the thin film material.

FIG. 3 shows a post calendering process. The film produced by system 10 may not be suitable as a finished product. Accordingly, the film may be calendered to increase density and/or decrease thickness. Film 64 may be passed through rollers 66 to adjust the thickness and/or density of the film to provide a product 68 having adequate properties. Rollers 66 may be heated and/or cooled as needed. While shown as a two roller calender, three or more rolls may be used. Preferably, the multilayer film is calendered to a density of about 1.5 g/cm$^3$ to 3.5 g/cm$^3$.

Figure 4:
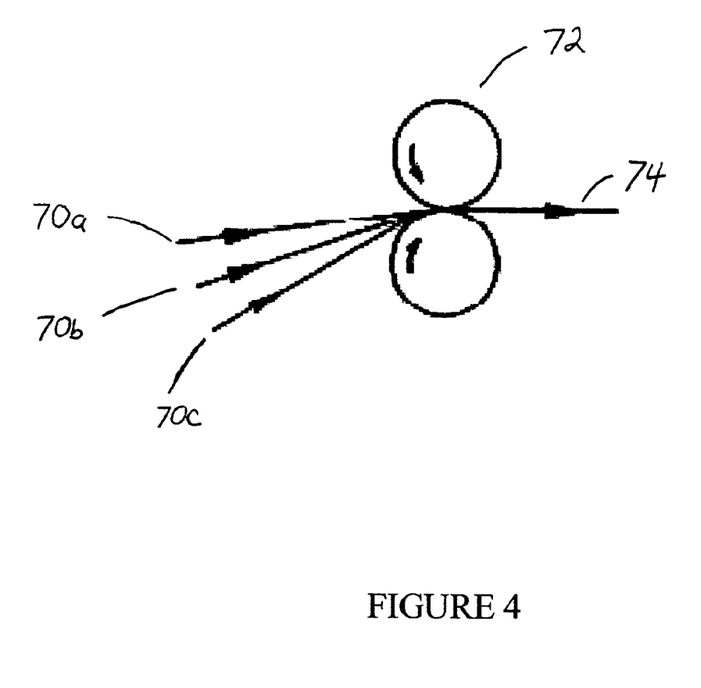
FIG. 4 is a schematic of one method of forming a multi-layer product according to the innovation.

FIG. 4 shows another post calendering process. Multiple films 70a, 70b, and 70c may be passed through a calender 72 to provide a product 74 having a desired thickness and/or density. Again calender 72 may be heated and/or cooled, and may include two or more rollers. Heated calenders may improve lamination of layers 70a-c with each other. Each of layers 70a-c may be the same or different (e.g., the layers may vary in solids content, composition, thickness, etc.). Each of layers 70a-c may independently be a monolayer material or a multilayer material (such as those produced by system 10 shown in FIG. 1). While three layers are shown, two layers, or four or more layers may be laminated.

Figure 5:
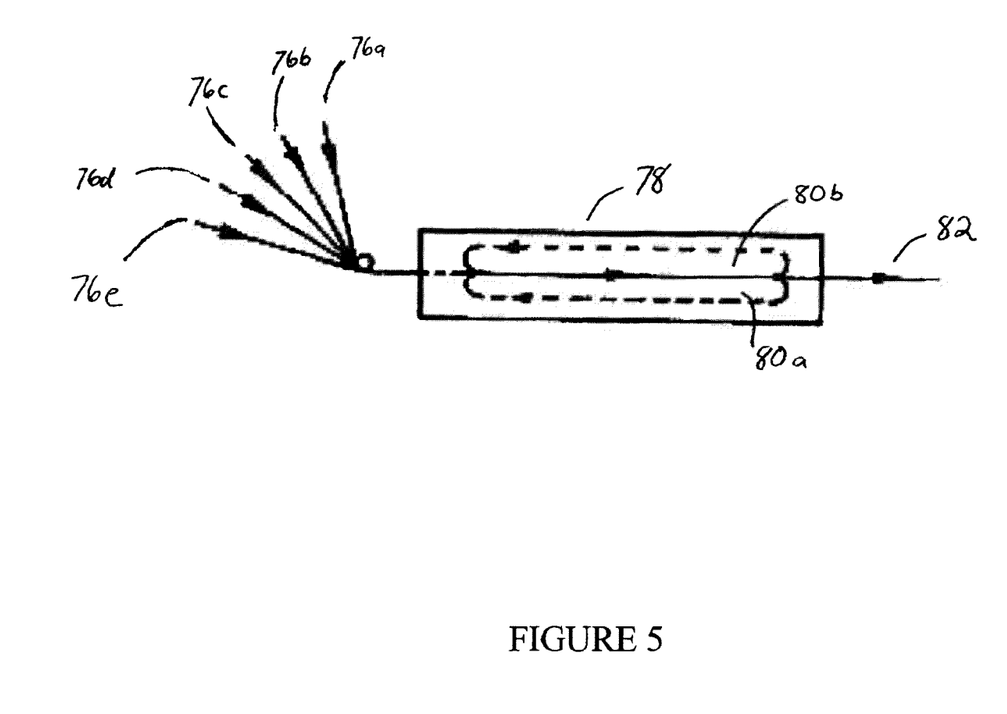
FIG. 5 is a schematic of a second method of forming a multi-layer product according to the innovation.

FIG. 5 shows yet another post calendering process. Layers 76a-e of EMI/RF absorbing material may be laminated in a flat bed laminator 78 to provide product 82. The layers may be alternated with adhesive web, or the layers may be joined as a result of heat and pressure applied to the layers which include a thermoplastic resin as it passes between belt rollers 80a and 80b.

Example 1

A four layer film was produced according to the process illustrated in FIG. 1. The first layer deposited on the release medium was a low solids content mixture having the following composition:

| Component | Weight Percent (wet) |
|---|---|
| Polyurethane Resin (SOLUCOTE 6629) | 52.7% |
| Dispersing Agent (DISPERBYK 111) | 1.57% |
| Uncoated Permalloy Flake | 5.21% |
| Coated Permalloy Flake | 20.28% |
| DMF | 6.57% |
| IPA | 6.57% |
| Toluene | 6.57% |

The second, third, and fourth layers were a high solids composition of the following composition:

| Component | Weight Percent (wet) |
|---|---|
| Polyurethane Resin (SOLUCOTE 6629) | 34.82% |
| Dispersing Agent (DISPERBYK 111) | 0.66% |
| Uncoated Permalloy Flake | 8.67% |
| Coated Permalloy Flake | 34.5% |
| DMF | 13.98% |
| IPA | 3.68% |
| Toluene | 3.68% |

The viscosity of the high solids composition was adjusted by the addition of DMF until a viscosity of about 4,500 to 6,500 cps at ambient temperature was reached.

The total amount of material deposited was 560 g/m$^2$. Of this, 80 g/m$^2$ was the low solids first layer. Each of the other three high solids layers were deposited in the amount of about 120 g/m$^2$. Advantageously, it has been found that processed-film scrap may be re-solvated and used in one or more of the layers without appreciable negative impact on the properties of the film. The third layer was entirely comprised of recycled processed-film scrap. After each layer was deposited, the coated release paper was passed through a conveyor oven to cure the resin.

The film had a thickness of about 13 to 15 mils. The film was then calendered to a thickness of about 9 mils. Post calendering was also performed under heat and pressure. The post calendering temperatures and pressures will depend on the thickness of the film. The post calendering process may aid in aligning the flakes parallel to one another and thus improve the EMI/RF absorption of the film.

The multilayered film was tested for EMI/RF absorption and found to be acceptable for shielding electronic components from EMI/RF in the frequency range of about 10 mhz to about 40 ghz. In particular, EMI/RF in the frequency range of about 100 mhz to about 5 ghz was absorbed. The multilayered film had a surface resistance of at least about 1 MΩ.

Although the foregoing has been described with reference to exemplary embodiments, workers skilled in the art will recognize that changes may be made in form and detail without departing from the spirit and scope thereof. For example, although different example embodiments may have been described as including one or more features providing one or more benefits, it is contemplated that the described features may be interchanged with one another or alternatively be combined with one another in the described example embodiments or in other alternative embodiments. The present subject matter described with reference to the example embodiments and set forth in the following claims is manifestly intended to be as broad as possible. For example, unless specifically otherwise noted, the claims reciting a single particular element also encompass a plurality of such particular elements. Many other changes and modifications may be made to the present invention without departing from the spirit thereof. The scope of these and other changes will become apparent from the appended claims. The steps of the methods described herein may be varied, and carried out in different sequences.

What is claimed is:

1. A method for producing an EMI/RF absorbing material, comprising:
    dispersing metallic flake in a resin;
    providing a first coat of the resin containing dispersed metallic flake using a knife-over-roll coater to form a first layer; and
    providing a second coat of the resin containing dispersed metallic flake to the first layer using a knife-over-roll coater to form a second layer, at least one of the first or second layers having a substantially uniform distribution of metallic flake throughout a thickness of the first or second layers;
    wherein the knife-over-roll coater orients a substantial portion of the metallic flake as the resin and metallic flake pass a knife of the knife-over-roll coater.

2. The method of claim 1, further comprising recirculating the resin and metallic flake in a dispersing tank to aid in preventing settling of the metallic flake within the resin.

3. The method of claim 1, further comprising providing a third coat of the resin containing dispersed metallic flake to the second layer.

4. The method of claim 1, further comprising curing the first coat of resin before providing the second coat of resin.

5. The method of claim 1, wherein the other of the first or second layers has a substantially uniform distribution of metallic flake throughout a thickness of the other of the first or second layers.

6. The method of claim 1, further comprising calendering at least one of the first and second layers to increase the density of the EMI/RF absorbing material or improve the EMI/RF absorption characteristics of the EMI/RF absorbing material.

7. The method of claim 6, further comprising calendering the other of the first and second layers to increase the density of the EMI/RF absorbing material or improve the EMI/RF absorption characteristics of the EMI/RF absorbing material.

8. The method of claim 1, wherein the first and second layers are laminated to provide an EMI/RF barrier of a desired thickness.

9. The method of claim 1, wherein the metallic flake comprises at least one of nickel, iron, and molybdenum.

10. A method for providing an EMI/RF absorbing material formed from at least two layers, comprising:
providing, using a knife-over-roll coater, a first layer having a thickness and comprising metallic flake dispersed in a polymer resin, the metallic flake being substantially uniformly distributed throughout the thickness of the first layer; and
providing, using a knife-over-roll coater, a second layer adjacent to the first layer having a thickness and comprising metallic flake dispersed in a polymer resin, the metallic flake being substantially uniformly distributed throughout the thickness of the second layer;
wherein the EMI/RF absorbing material has a substantially uniform distribution of the metallic flake throughout the total thickness of the first and second layers of the EMI/RF absorbing material.

11. The method of claim 10, further comprising a third layer adjacent to at least one of the first layer and the second layer, the third layer having a thickness and comprising metallic flakes dispersed in a polymer resin, the metallic flake being substantially uniformly distributed throughout the thickness of the third layer.

12. The method of claim 10, wherein the second layer is provided to the first layer after the first layer is subjected to a drying process.

13. The method of claim 10, wherein the EMI/RF absorbing material is effective for absorbing at least a portion of electromagnetic waves having a frequency of about 10 MHz to about 40 GHz.

14. The method of claim 10, further comprising calendering at least one of the first and second layers to increase the density of the EMI/RF absorbing material or improve the EMI/RF absorption characteristics of the EMI/RF absorbing material.

15. The method of claim 10, wherein the first and second layers are laminated to provide an EMI/RF barrier of a desired thickness.

16. A method for manufacturing an EMI/RF absorbing film comprising:
dispersing EMI/RF absorbing material in a polyurethane-based polymer resin, wherein the EMI/RF absorbing material comprises metallic flake;
distributing the polymer resin and dispersed EMI/RF absorbing material on a release medium;
curing the polymer resin to form a film; and
releasing the film from the release medium;
wherein the EMI/RF absorbing material is substantially uniformly distributed throughout a thickness of the film.

17. The method of claim 16, further comprising recirculating the polymer resin and dispersed EMI/RF absorbing material in a recirculating system to aid in preventing settling of the EMI/RF absorbing material within the polymer resin.

18. The method of claim 16, wherein curing includes evaporating solvent.

19. The method of claim 16, further comprising solvating the polymer resin.

20. The method of claim 19, wherein the polymer resin is an aliphatic polyurethane resin solvated using at least one solvent selected from the group consisting of toluene, isopropyl alcohol, and dimethylformamide.

21. The method of claim 16, further comprising calendering the cured polymer resin.

22. The method of claim 16, further comprising calendering a plurality of films to provide a multilayered film.

23. A method for manufacturing an EMI/RF absorbing material having a relatively heavy metallic flake dispersed in a resin, the method comprising:
providing a reservoir of resin;
providing metallic flake in the resin;
recirculating the resin and metallic flake to aid in preventing settling of the metallic flake within the resin, the recirculating comprising drawing the resin and metallic flake from a bottom portion of a tank having a substantially conical bottom portion and returning the resin and metallic flake to an upper portion of the tank;
distributing the resin and metallic flake to create a first layer; and curing the first layer.

24. The method of claim 23, further comprising distributing the resin and metallic flake to create a second layer.

25. The method of claim 24, wherein the metallic flake is substantially uniformly distributed throughout a thickness of at least one of the first and second layers.

26. The method of claim 24, further comprising calendering at least one of the first and second layers.

27. The method of claim 24, further comprising distributing the resin and metallic flake to create a third layer, the first, second, and third layers being a laminate.

28. A method for manufacturing an EMI/RF absorbing film comprising:
dispersing EMI/RF absorbing material in a polyurethane-based polymer resin;
distributing the polymer resin and dispersed EMI/RF absorbing material on a releasable medium;
curing the polymer resin to form a film, wherein the EMI/RF absorbing material is substantially uniformly distributed throughout a thickness of the film;
releasing the film from the releasable medium; and
calendering a plurality of films to provide a multilayered film.

\* \* \* \* \*